United States Patent
Hauser et al.

(10) Patent No.: US 6,525,416 B2
(45) Date of Patent: Feb. 25, 2003

(54) ELECTRONIC DEVICES AND A SHEET STRIP FOR PACKAGING BONDING WIRE CONNECTIONS OF ELECTRONIC DEVICES AND METHOD FOR PRODUCING THEM

(75) Inventors: Christian Hauser, Regensburg (DE); Johann Winderl, Wackersdorf (DE); Martin Reiss, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/970,979

(22) Filed: Oct. 4, 2001

(65) Prior Publication Data

US 2002/0041017 A1 Apr. 11, 2002

(30) Foreign Application Priority Data

Oct. 4, 2000 (DE) .......................................... 100 49 288

(51) Int. Cl.[7] .......................... H01L 23/22; H01L 23/24
(52) U.S. Cl. .................... 257/687; 257/678; 257/704; 257/710; 257/730; 257/731; 257/787
(58) Field of Search ................................ 257/678, 687, 257/704, 710, 730, 731, 787

(56) References Cited

U.S. PATENT DOCUMENTS 5,424,250 A * 6/1995 Sawada ........................ 437/211
6,262,513 B1 * 7/2001 Furukawa et al. ......... 310/313 R

FOREIGN PATENT DOCUMENTS

DE 34 42 131 A1 5/1986
DE 195 07 124 A1 9/1995

* cited by examiner

*Primary Examiner*—Albert W. Paladini
*Assistant Examiner*—David A. Zarneke
(74) *Attorney, Agent, or Firm*—Laurence A. Greenberg; Werner H. Stemer; Gregory L. Mayback

(57) ABSTRACT

An electronic device is described that has a sheet strip for packaging bonding wire connections of the electronic device and a method for producing it. To that end, the sheet strip, has at least two preformed, opposite edge regions which cover the edge regions of the bonding channel in an overlapping manner. Furthermore, the sheet strip has a preformed central region situated between the edge regions, which central region has a bulge and thickened portion and has two convexly curved contour lines in cross section.

15 Claims, 3 Drawing Sheets

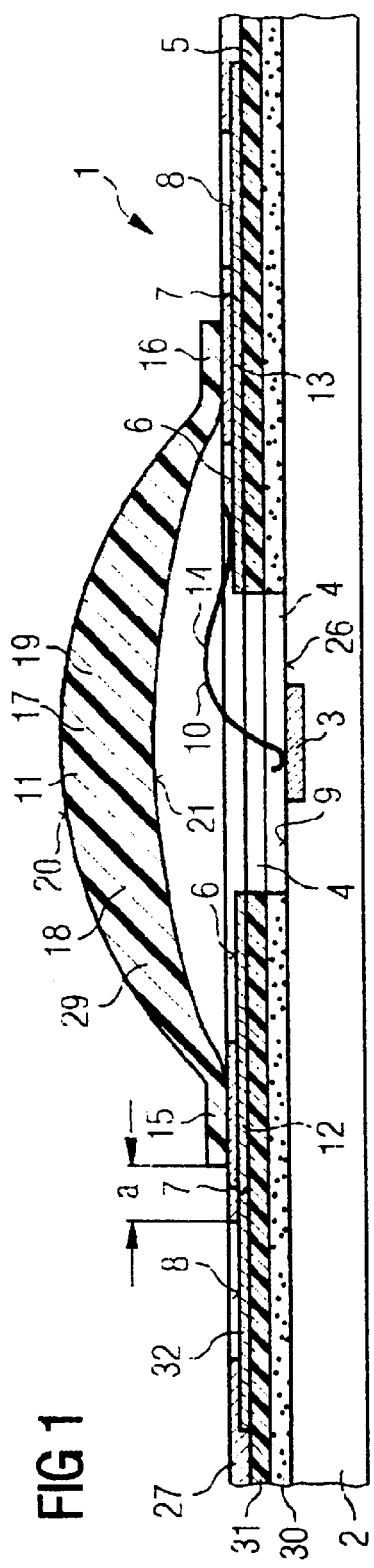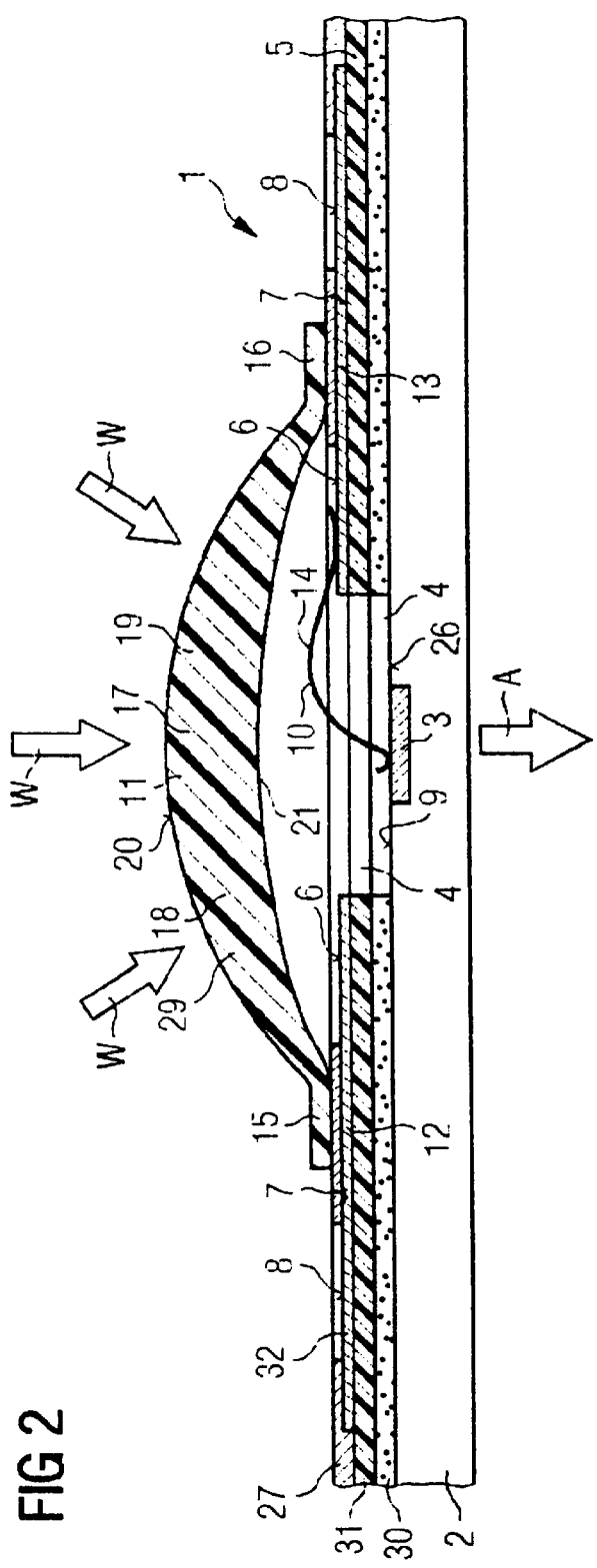

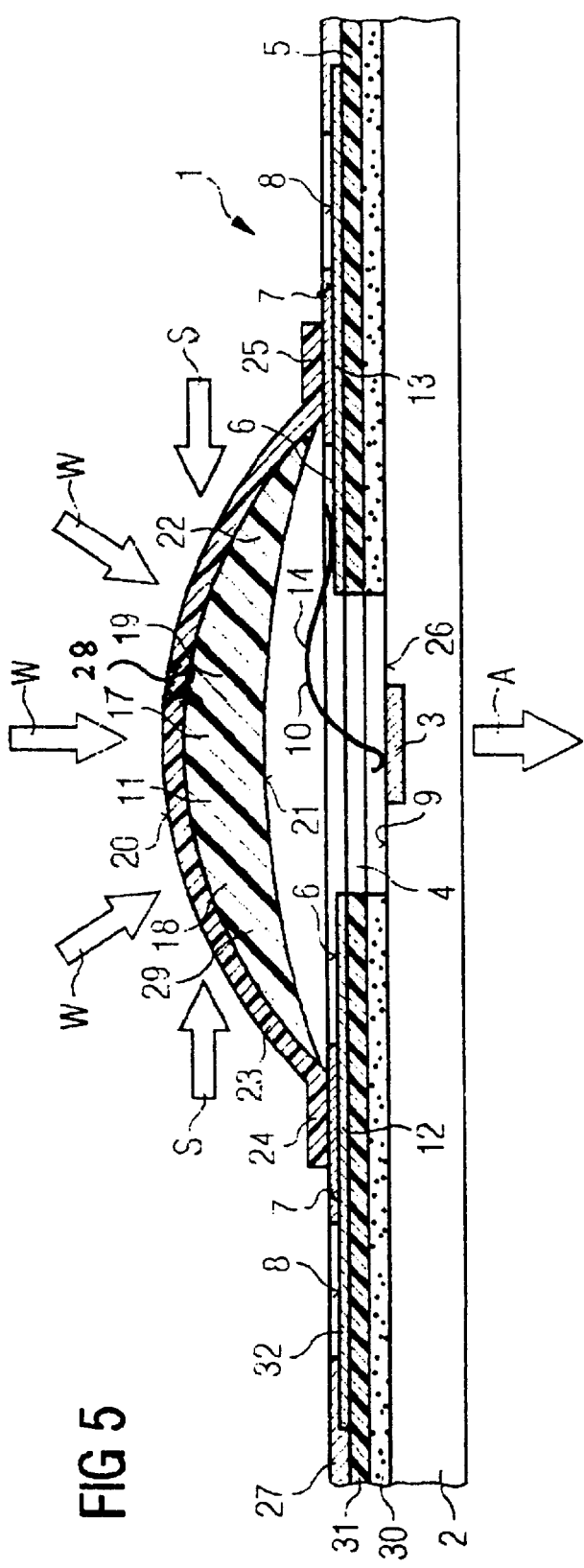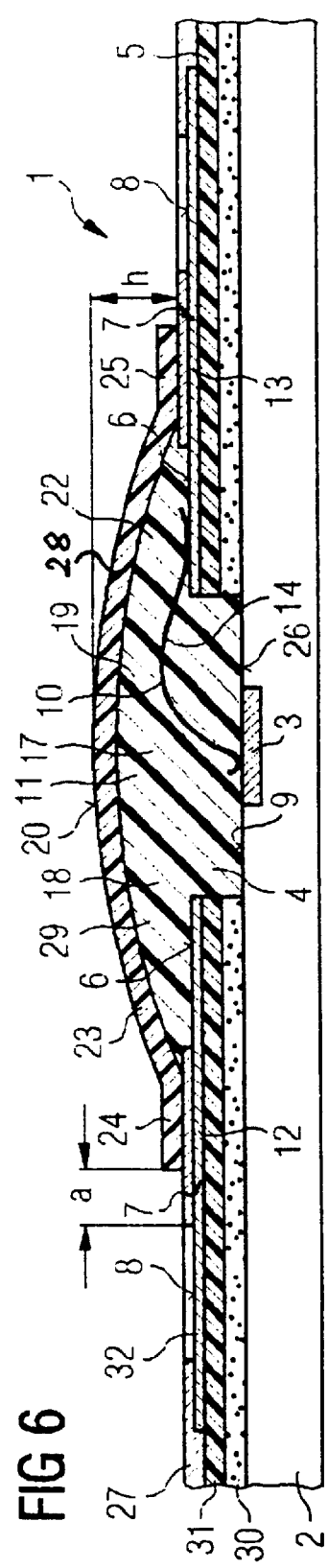

ELECTRONIC DEVICES AND A SHEET STRIP FOR PACKAGING BONDING WIRE CONNECTIONS OF ELECTRONIC DEVICES AND METHOD FOR PRODUCING THEM

BACKGROUND OF THE INVENTION

Field of the Invention

The invention relates to electronic devices and a sheet strip for packaging bonding wire connections of the electronic devices and method for producing them.

Electronic devices having a chip and a housing disposed directly on an active surface of the chip have a bonding channel or bonding pads in which bonding wire connections from contact areas on the active surface of the chip to contact connection areas on a lead frame are disposed. The lead frame itself furthermore has conductor tracks that lead from the contact connection areas via conductor tracks to soldering contact areas. Soldering bumps or soldering balls can be disposed as external contacts of the electronic device on the soldering contact areas.

In order to protect the bonding wires, the bonding channel or the bonding pads must be potted with a plastic compound, the potting compound completely encapsulates the bonding wires.

During the production of such electronic devices, there is the risk, during the potting of the bonding wires with the plastic compound, that their potting height will exceed the height of the soldering balls or soldering bumps and thus jeopardize external contact connection of the electronic device. Moreover, there is the risk that the soldering compound will partly wet the soldering contact areas of the lead frame and impede reliable soldering of the soldering balls or soldering bumps. Consequently, additional problems arise during the production of such electronic devices, which problems reduce the productivity.

Published, Non-Prosecution German Patent Application DE 34 42 131 A1 describes a method for encapsulating microelectronic semiconductor and layered circuits, in which a soft, sealable plastic layer is potted over components situated on a substrate. The components are covered with a plastic/metal composite sheet and then encapsulated with a hard, thermal-shock-resistant synthetic resin potting compound. The outer plastic layers of the plastic/metal composite sheet bond with the filling or the potting compound and form a temperature-and moisture-resistant encapsulation in this way. Furthermore, Published, Non-Prosecuted German Patent Application DE 195 07 124 discloses an electronic device that has, on a substrate, a surface region that is to be protected against contact and pressure. For this purpose, the substrate surface region requiring protection is completely enclosed by a resin sheet, an empty space being provided within the resin sheet. In this case, one of the surfaces of the resin sheet can be covered with a layer made of a conductive material. In order to produce the electronic device, the resin sheet is folded above the substrate in such a way that an interspace remains between the resin sheet and the surface region requiring protection. Open side edges of the folded resin sheet are thermally sealed, thereby forming a cavity that encloses the surface region requiring protection.

SUMMARY OF THE INVENTION

It is accordingly an object of the invention to provide electronic devices and a sheet strip for packaging bonding wire connections of the electronic devices and a method for producing them that overcome the above-mentioned disadvantages of the prior art devices and methods of this general type, in which the potting height is adjustable and soldering contact areas adjacent to the bonding channel are not wetted.

With the foregoing and other objects in view there is provided, in accordance with the invention, an electronic device. The electronic device contains a chip having an active surface and contact areas and a laminate disposed on the active area of the chip and having a bonding channel with edge regions formed therein. The laminate further has contact connection areas, conductor tracks and soldering contact areas and surrounds the bonding channel. The contact areas of the chip are disposed along the bonding channel. Bonding wires connect the contact areas of the chip to the contact connection areas of the laminate. A flowable sheet formed of a potting compound surrounds the bonding wires in the bonding channel. The flowable sheet overlaps the edge regions of the bonding channel, and the flowable sheet is a flowable sheet strip or flowable sheet patches.

The invention provides the electronic device to have the chip with the contact areas disposed along the bonding channel or within the bonding pads and the laminate which bears contact connection areas, conductor tracks and soldering contact areas on a lead frame, the laminate surrounds the bonding channel or the bonding area and is disposed on the active surface of the chip. In the case of the electronic device, the contact areas are connected to the contact connection areas via bonding wires and, by a flowable sheet strip which overlaps the edge regions of the bonding channel and serves as a potting compound for the bonding channel, the bonding wires are surrounded by the plastic compound of the flowable sheet strip.

For this purpose, the sheet strip itself contains at least two preformed, mutually opposite edge regions, which cover the edge regions of the bonding channel or of the bonding pads in an overlapping manner, and a preformed central region situated in between, which central region has a bulge and thickened portion and exhibits two convexly curved contour lines in its cross section. The central region of the sheet strip has the advantage that it can be put into a flowable state and then completely fills the bonding channel, an impermissible potting elevation being precluded by the preshaping of the central region and the potting height being adjustable by selection of a thickened portion of the central region.

Furthermore, the edge region of the sheet strip which overlaps the bonding channel ensures that soldering contact areas adjacent to the bonding channel can no longer be wetted since the edge dimensions of the sheet strip are now precisely defined and the situation where sheet material reaches the soldering contact areas adjacent to the bonding channel is thus precluded from the outset. Consequently, for electronic devices which have been equipped with such a flowable sheet strip, the result is that the main causes of rejects during the production of such electronic devices have been eliminated.

In one embodiment of the invention, the sheet strip is a composite strip containing a sheet strip having a varying thickness over the cross section, in other words the central region has a bulge and a thickened portion and a covering strip of uniform thickness. The covering strip of uniform thickness is less flowable than the sheet strip and provides for the maintenance of the dimensions in particular in the edge regions, with the result that wetting of adjacent soldering connection areas is precluded.

In a further embodiment of the invention, the covering strip is produced from a shrink material and the edge regions of the covering strip are adhesively fixed on the edge regions of the bonding channel. What is thereby achieved is that, during the heating of the sheet material in its flowable state, the covering strip shrinks on the flowable sheet material and thus presses the flowable sheet strip compound into the bonding channel and between and around the bonding wires.

In a further embodiment of the invention, the thickened portion in the central region of the sheet strip is matched exactly to the bonding channel volume, thereby advantageously ensuring that the potting compound height never exceeds the height of the soldering balls or soldering bumps and nevertheless completely surrounds the bonding wires.

A further embodiment of the invention provides for parallel edge regions of the sheet strip that overlaps the edge regions of the bonding channel to be connected gas-tightly to the edge regions of the bonding channel. The gas-tight connection can be achieved by an adhesive layer or by laminating the sheet edge regions onto the edge regions of the bonding channel. The gas-tight connection process has the advantage that the bonding channel is completely shielded against ambient influences and a long service life can be guaranteed for the bonding wire connections.

In a further embodiment of the invention, the flowability of the sheet material of the sheet strip commences at a threshold temperature. As long as the threshold temperature is not reached, the housing and the electronic device produced with the sheet material remains stable and solid, whereby the maximum of a possible operating temperature is defined at the same time. The higher the threshold temperature of the sheet strip, the greater the extent to which the housing of the electronic device can be thermally loaded.

In a further embodiment of the invention, the ratio between the maximum thickness in a central region of the sheet strip to the thickness in edge regions is 3:1. A sheet strip having such a triple thickness in the central region relative to the edge regions is suitable for filling relatively shallow bonding channels with the plastic compound. For deeper bonding channels, the ratio between the maximum thickness in the central region of the sheet strip and the thickness of the covered edge regions is 5:1. The advantage of the invention then, is that the sheet strips can be matched very precisely to the dimensions and depths of the bonding channels, these two preferred thickness ratios, presented above, between the central region and edge region of the sheet strip covering a large proportion of the production of electronic devices. Finer gradations are possible but the storage and inventory costs increase at the same time.

In a further embodiment of the invention, a convex curvature of the sheet strip in the central region of its cross section is larger than an elevation of the bonding wire connection beyond the bonding channel. Since the bonded wires themselves have a slight elevation beyond the bonding channel, since they have to be led from the contact areas of the chip on the bottom of the bonding channel to the contact connection areas of the lead frame onto the edge of the bonding channel, this embodiment of the invention ensures that, in the solid state of the sheet strip, the sheet strip does not touch the bonding wire connections but rather maintains a safety clearance from the bonding wire connections with its convex curvature in the central region.

The material of the lead frame is, in particular in the case of housings that are disposed directly on the active side of the chip, a laminate containing an insulating layer and a patterned metal layer laminated thereon. The laminate is disposed on the active side of the chip and has the bonding channel or the bonding pads or a plurality of bonding channels in the region of the contact areas of the chip. In a further embodiment of the invention, such a laminate may have a porous plastic as an insulating material, which has the advantage that the air cushion below the sheeted material in the bonding channel can migrate via the porous laminate layer when the sheet material is heated to flowing temperature, with the result that the sheet material of the central region completely fills the bonding channel and wets the surfaces thereof and also embeds the bonding wires in plastic.

In a further embodiment of the invention, the bonding-channel-forming laminate layer is made of gas-tight plastic. In this case, the gas or air cushion between the sheet strip disposed above the bonding channel and the bottom of the bonding channel cannot readily escape. In this case, the sheet strip is laminated onto the edge regions of the bonding channel under a vacuum, with the result that there is no gas or air cushion between the sheet material and the bottom of the bonding channel.

In one embodiment of the invention, the lead frame, which is adhesively applied on a semiconductor chip by an adhesive layer, can contain the laminate which forms the bonding channel and has, on its surface facing the sheet strip, the contact connection areas for the bonding connections, the conductor tracks for relaying electrical signals and the soldering contact areas for the external connections of the electronic device. The laminate provided with the contact connection areas, the conductor tracks and the soldering contact areas has the task of distributing the microscopically small contact areas on the active surface of the semiconductor chip between large-area soldering contact areas for which the entire area of the semiconductor chip is available on the laminate layer.

In this connection, "microscopically small" means an order of magnitude which can still be discerned or measured only with an optical microscope, whereas the soldering contact areas for soldering bumps or soldering balls on the laminate layer are discernible to the naked eye. The housing of such an electric device thus essentially contains the bonded-on laminate, the associated bonding channel with the bonding wire connections, the laminate bearing a patterned metal layer which has the contact connection areas, the conductor tracks and the soldering contact areas, and also the soldering balls or soldering bumps soldered onto the soldering contact areas as external contact connections.

Consequently, an improvement in the miniaturization results for the electronic device having the bonding channel covered by the sheet strip, since the proportion of housing-forming components relative to the chip volume is reduced to a minimum. On account of their small housing height, such electronic devices according to the invention are preferably used as sensor areas for fingertip sensors or as smart card modules in credit cards, telephone cards, etc. Furthermore, the devices according to the invention can be connected directly by the soldering balls and soldering bumps to flexible bus lines or to printed circuit boards.

In a further embodiment of the invention, the bonding-channel-forming laminate layer has a soldering mask layer on its surface facing the sheet strip, which layer partly covers the conductor tracks and frees both the contact connection areas for bonding and the soldering contact areas for application of soldering bumps or soldering balls. The soldering mask layer thus assists the patterning of the metal layer, with the result that the solder of a soldering bump or soldering ball remains limited to a limited region of the patterned metal layer and does not flow along the conductor tracks. The soldering mask layer is a patterned resist layer made of plastic that is partly covered by the sheet in the edge region when the bonding channel is covered.

With the foregoing and other objects in view there is also provided, in accordance with the invention, a method for producing an electronic device. The method includes the steps of providing a semiconductor chip having contact areas and disposing a laminate on the semiconductor chip. The laminate has contact connection areas, conductor tracks and soldering contact areas. The laminate further has bonding channels formed therein for exposing a surface of the semiconductor chip on which the contact areas are disposed at a bottom of the bonding channel. The contact areas are connected to the contact connection areas on the laminate using a bonding wire resulting in bonding wire connections. A sheet strip is positioned above the bonding channel with edge regions of the bonding channel being overlapped by edge regions of the sheet strip. The edge regions of the sheet strip are laminated onto the edge regions of the bonding channel, with the result that a convexly curved central region of the sheet strip arches over the bonding channel with the bonding wires. The sheet strip is heated to a flow temperature of the sheet strip causing a melting of the sheet strip in a central region resulting in a potting of the bonding wires. The sheet strip in the bonding channel is then cooled.

Such a method has the advantage that the encapsulation of the bonding wire connection in the bonding channel is carried out by the sheet strip whose dimensions are exactly matched, with the result that adjacent soldering contact areas on the laminate are not wetted by the potting compound and, in addition, the convexly curved center region can on the one hand be dimensioned in such a way that, before the heating of the sheet strip, it arches over the bonding wires and, consequently, does not touch them and, after the heating of the sheet strip, completely embeds the bonding wires in the plastic compound of the sheet strip. In this case, a bonding channel elevation is ensured which is smaller than the elevation by the soldering balls and soldering bumps on the soldering contact areas.

In an exemplary implementation of the method, a porous plastic is used as the laminate, with the result that air cushions in the bonding channel escape via the porous laminate when the sheet strip is melted in the central region. This has the advantage that no air bubbles whatsoever remain and the central region of the sheet material can attach itself completely to the bonding wires and forms no impermissible bonding channel elevation whatsoever, but rather merely forms a permissible minimal elevation for covering the bonding wires.

In a further exemplary implementation of the method, the lamination of the sheet strip is carried out under a vacuum. This is advantageous when the laminate itself is a gas-tight plastic rather than a porous plastic, with the result that air cushions are removed by evacuation in a vacuum chamber before the bonding channel is actually closed off.

In a further exemplary implementation of the method, a heating iron or punch is used to heat the central region of the sheet strip. The heating punch can, in a targeted manner, heat the central region to a greater extent than the edge region, with the result that the material of the central region of the sheet strip according to the invention fills the volume of the bonding channel in molten fashion, while the edge region is laminated on. Such heating punches do not have to be completely sealed off from the laminate surface or from the surface of the soldering mask layer since the boundaries of the plastic potting compound are set by the precisely defined sheet edge, with the result that such a heating punch can be realized relatively inexpensively and the orientation of the heating punch remains non-critical.

In an exemplary implementation of the method that forms an alternative to the heating punch, an infrared radiator is used to heat the central region of the sheet strip. Such an infrared radiator has the advantage that its radiation energy can be projected onto the central region without the device being touched by auxiliary tools, with the result that an abutment or a support of the device does not have to take up a punch pressure, as would be necessary with a heating punch.

A further exemplary implementation of the method according to the invention provides for a scanned laser beam to be used to laminate the edge regions of the sheet strip onto the edge regions of the bonding channel. This method has the advantage that the lamination can be carried out in a locally delimited manner and the edge regions of the sheet strip can be fixed onto the edge regions of the bonding channel before the central region and separately from the central region. This method can be used particularly advantageously in the case of lamination under a vacuum, since the sheet strip only has to be positioned without being fixed, with the result that it is possible to evacuate the air cushion in the bonding channel region and the lamination can be effected by a scanned laser beam only after the evacuation of this region, too. After the lamination by the scanned laser beam, the central region of the sheet material can be made to melt by a scanned laser beam and, consequently, the sheet strip material can completely embed the bonding wire connections in the bonding channel region.

A further exemplary implementation of the method provides for in the case of a composite sheet containing shrink sheet strip as covering sheet and sheet strip, after the lamination of the edge regions of the shrink sheet strip onto the edge regions of the bonding channel, by the scanned laser beam, the composite sheet is heated and the shrink sheet as a covering sheet presses the molten central region of the sheet strip into the bonding channel with the bonding wires being embedded. The method advantageously uses the property of the shrink sheet, which, upon being heated, wants to occupy the smallest possible surface area that it had occupied on account of its memory effect before being used as a covering strip. Consequently, the shrink sheet endeavors to shorten its extent on the curved-convex surface of the sheet material, as a result of which, upon being heated, it presses the flowable sheet material into the bonding channel and thus at the same time permits an increased operating temperature compared with electronic devices without a covering sheet.

By the method according to the invention, board-on-chip (BOC) housings are potted after the wire bonding process. The potting is effected in such a way that the bonding wires are completely encapsulated. The potting height must not be too large since otherwise conflicts arise with the stand-off or the elevation of the soldering balls. In addition, the distance during the flow process is limited, especially as soldering contact areas contaminated with the potting compound would impede the soldering of the soldering balls.

The bonding wires are encapsulated by a sheet or a sheet patch, which, on the one hand, are laminated onto the rewiring substrate and, on the other hand, as a result of the melting of the central part of the sheet or of the sheet patch, fill the bonding channel or bonding pads and thereby cover wires.

The sheet or the sheet patch is constructed as follows. The sheet patch is composed of a flowable material, such as a thermosetting plastic or a mixture of thermoplastic and thermosetting plastic, or the sheet is coated with a flowable material which is heated through the action of temperature—for example by a special heating punch or an IR radiator—becomes flowable as a result and is thus able to fill the bonding channel. The sheet material is in a solid state before the action of temperature. In order to avoid blisters in the case of a sheet, it is possible to employ a porous lead frame or vacuum. The central region of the sheet or of the sheet patch is convexly curved through special shaping e.g. during the production of the sheet, with the result that the central region does not bear directly on the bonding wires during the lamination process or the wires are not damaged. A pre-stretched sheet, which is comparable to a shrink sheet with memory effect, would additionally cause the sheet to be drawn into the bonding channel under the influence of temperature.

Other features which are considered as characteristic for the invention are set forth in the appended claims.

Although the invention is illustrated and described herein as embodied in electronic devices and a sheet strip for packaging bonding wire connections of the electronic devices and a method for producing them, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view of an electronic device before the embedding of bonding connections in a plastic compound by a sheet strip according to a first embodiment according to the invention;

FIG. 2 is a diagrammatic, cross-sectional view of the electronic device with an emplaced sheet strip above a bonding channel under the action of heat;

FIG. 5 is a diagrammatic, a cross-sectional view of the electronic device with an emplaced composite sheet strip above the bonding channel under the action of heat and shrinkage effects; and FIG. 6 is a diagrammatic, cross-sectional view of the electronic device after the action of heat on the sheet strip.

DESCRIPTION OF THE PREFERRED EMBODIMENTS

Figure 3:
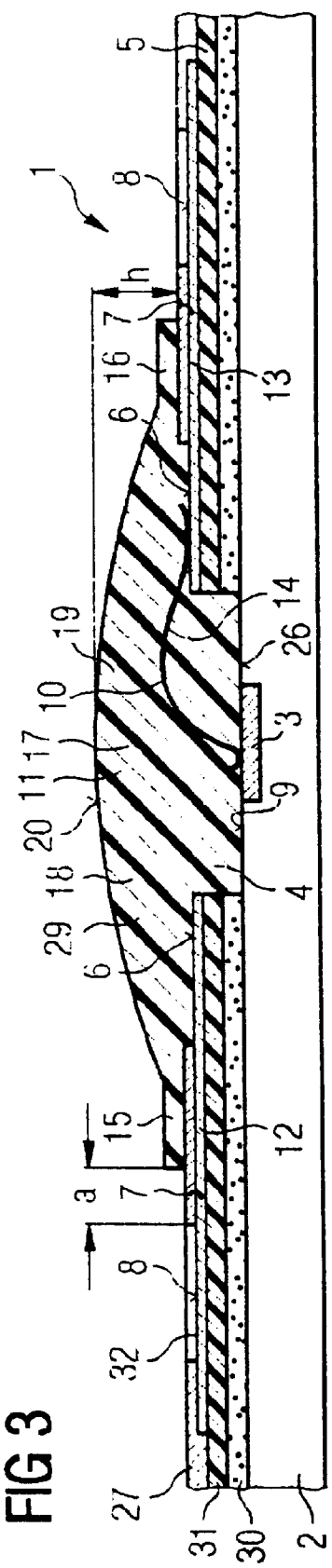
FIG. 3 is a diagrammatic, cross-sectional view of the electronic device after the action of heat on the sheet strip.

Referring now to the figures of the drawing in detail and first, particularly, to FIG. 1 thereof, there is shown an electronic device 1 before the embedding of bonding connections 14 in a plastic compound 29 by a sheet strip 11 of a first embodiment of the invention. In FIG. 1, the reference numeral 2 designates a chip, the reference numeral 3 designates contact areas, the reference numeral 4 designates a bonding channel, the reference numeral 5 designates a laminate for a rewiring with contact areas 6, conductor tracks 7 and soldering contact areas 8. The reference numeral 9 in FIG. 1 designates an active surface of the chip 2, the reference numeral 10 designates bonding wires, and the numerals 12 and 13 designate edge regions of the bonding channel 4.

The bonding connections 14 reach from the contact areas 3 on the active surface 9 of the chip 2 at a bonding channel bottom 26 as far as a surface of the laminate 5 with the contact connection areas 6 for the bonding connections 14. After being placed onto the electronic device 1, the sheet strip 11 arches over the bonding channel 4 and is supported on the bonding channel edge regions 12 and 13. In this case, the edge regions 15, 16 of the sheet strip 11, which lie on the edge regions 12 and 13 of the bonding channel 4, are thinner than a central region 17 of the sheet 11, which simultaneously has a thickened portion 19 in addition to a bulge 18 in the central region 17.

On account of the thickened portion 19, the sheet strip 11 has, in the central region 17, a convexly curved outer contour line 20 and a convexly curved inner contour line 21 with a lower degree of curvature than the outer contour line 20, as seen from the bonding channel 4. The laminate 5 is bonded with the aid of an adhesive layer 30 directly onto the active surface 9 of the chip 2 with its insulating layer 31. A metallic layer 32 of the laminate 5 has, in direct proximity to the bonding channel 4, the exposed contact connection areas 6 for receiving the bonding connection 14 and is patterned for a rewiring in the conductor tracks 7. The conductor tracks 7 lead to exposed soldering contact areas 8 distributed on the laminate layer 5.

Of the patterned metallic layer 32, only the soldering contact areas 8 and the contact connection areas 6 are left free by a soldering mask layer 27 disposed on the metallic layer 32, with the result that the bonding wire 10 can be led from the active surface 9 of the semiconductor chip 2 at the channel bottom 26 of the bonding channel 4 to the contact connection area 6 of the metallic layer 32. The bonding channel 4 can also contain individual bonding pads that are introduced into the laminate layer 5 and over which a short section of a sheet strip 11 can arch, as illustrated in FIG. 1.

If a plurality of the bonding connections 14 are disposed in a row in the bonding channel 4 of the electronic device 1, then a correspondingly wider section of the sheet strip 11 is arched over the bonding channel 4. Consequently, the sheet strip 11 has the advantage that it can be matched to any size of a bonding pad or bonding channel in a laminate layer 5. In order to fix the edge regions 15 and 16 of the sheet strip 11 onto the edge regions 12, 13 of the bonding channel 4, these can be laminated onto the soldering mask layer 27 by local heating. Another possibility for fixing the edge regions 15, 16 of the sheet strip 11 and the bonding channel 4 consists in the sheet strip 11 being bonded on. Finally, it is also possible for the sheet strip 11 merely to be emplaced and subjected to a heat treatment.

FIG. 2 shows the electronic device 1 with the emplaced sheet strip 11 above the bonding channel 4 under the action of heat in the direction of an arrow W. Components having functions identical to those in FIG. 1 are identified by the same reference symbols in FIG. 2. Under the action of heat in the direction of the arrow W, in particular the central region 17 with its thickened portion becomes molten, whereas the edge regions 15 and 16 of the sheet strip 11 which are supported on the edge regions 12, 13 of the bonding channel, essentially maintain their form due to the cool chip 2 and the laminate 5 which is heated to a lesser extent, with the result that only the dome arching over the bonding channel 4 collapses from the central region 17 of the sheet strip 11 and embeds the bonding connections 14 in molten fashion and wets the surfaces of the bonding channel 4 and also the contact connection areas 6 of the laminate layer 5.

To that end, the thickened portion of the central region 17 of the sheet strip 11 is chosen such that the bonding connections 14 are completely covered with the plastic compound 29 but in a minimal elevation relative to the surface of the soldering mask layer 27. When soldering bumps or soldering balls are subsequently applied to the soldering contact areas 8, the soldering bumps and soldering balls have a significantly greater elevation than the elevation of the plastic compound 29 embedding the bonding wires 14 in the bonding channel 4.

Associated with the flowing of the plastic compound 29 into the bonding channel 4 there is a reduction in the convex outer curvature 20 of the sheet strip 11. The application of the plastic compound 29 to the surfaces disposed below the sheet strip 11 can be assisted by evacuation in the direction of an arrow A, as is shown in FIG. 2. To that end, the insulating layer 31 of the laminate 5 is composed of a porous plastic with open pores. If laminates 5 with closed pores or made of non-porous plastic are used, the component is accommodated in a vacuum chamber before the lamination or bonding of the sheet strip 11 above the bonding channel 4, with the result that no gas cushions can form below the sheet strip 11. Furthermore, introducing the electronic device 1 with the sheet strip 11 bearing on it into a vacuum chamber has the advantage that the surfaces can be vacuum-dried before and during the heating of the sheet strip 11, with the result that intensive wetting of the plastic compound 29 occurs at the surfaces to be potted.

FIG. 3 diagrammatically shows a cross-sectional view of the electronic device 1 after the action of heat on the sheet strip 11. Components of FIG. 3 which fulfill the same functions as in FIGS. 1 and 2 are identified by the same reference symbols and will not be explained again. The electronic device 1 produced in this way has the advantage that a region which is closely delimited by the dimensions of the sheet strip 11 is potted with the plastic compound 29. The plastic compound 29 exhibits an elevation h, which is significantly smaller than the non-illustrated elevation of the soldering bumps or soldering balls, thereby ensuring reliable access to the external contact connections of the electronic device 1.

The sheet strip 11 thus makes it possible for the electronic device 1 to be covered, in the region of the bonding channel 4, with a relatively flat to slightly convexly curved outer contour line 20 in the cross-sectional view. Only a precisely delimited and exactly defined edge region around the bonding channel 4 is covered with the plastic compound 29 with a clear distance a from the soldering contact areas 8, which, on account of the high spatial precision of the plastic strip 11, can still be discerned on the finished product with connection contact bumps or connection contact balls and, disposed in between, the bonding channel 4 covered with the sheet strip 11.

Figure 4:
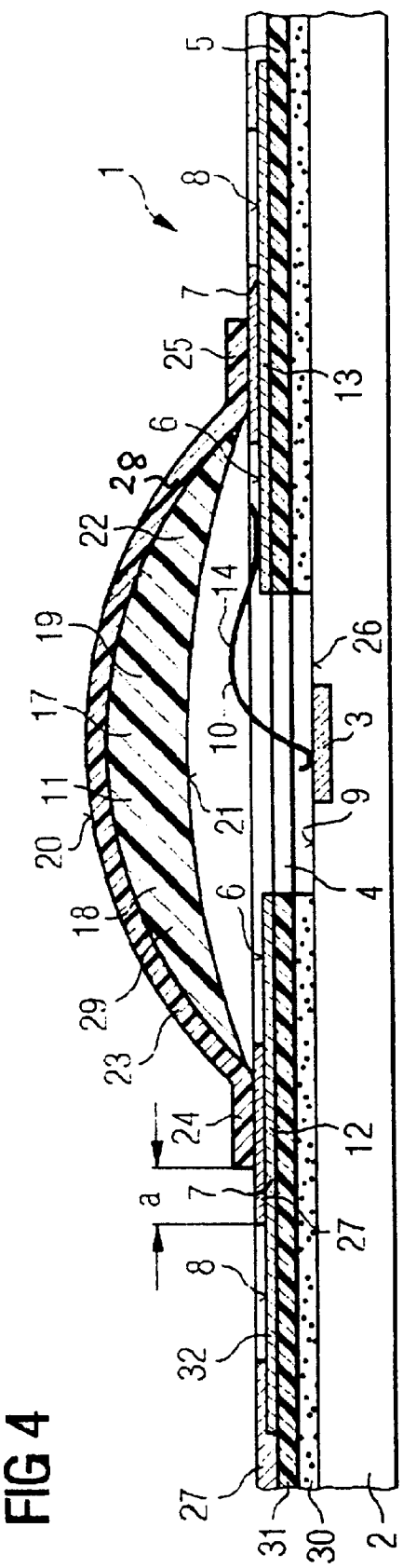
FIG. 4 is a diagrammatic, cross-sectional view of the electronic device before the embedding of the bonding connections by the sheet strip according to a second embodiment of the invention.

FIG. 4 diagrammatically shows a cross-sectional view of the electronic device 1 before the embedding of the bonding connections 14 by a composite sheet strip 22. In FIG. 4, identical components with functions identical to those in FIG. 1 to 3 are identified by the same reference symbols and are not explained in any further detail. The composite sheet strip 22 contains an outer covering strip 23 of uniform thickness and the sheet strip 11 that has a thickened portion and a bulge in the central region 17. The covering strip 23 is a shrink sheet strip 28 in this exemplary embodiment.

On account of a memory effect, such a shrink sheet strip 28 attempts to shorten its extents under the action of heat and in this case, in the embodiment according to FIG. 4, exerts a pressure on the sheet strip 11 connected to the shrink sheet strip 28, with the result that, in the molten state of the sheet strip 11, the resulting plastic compound 29 is pressed into the bonding channel 4.

FIG. 4 only shows the emplacement of the composite sheet strip 22 onto the region of the bonding channel. In this case, the defined distance a from the exposed soldering contact areas 8 is maintained. In edge regions 24 and 25 of the composite sheet strip 22, the latter, in this embodiment, is composed only of the material of the covering strip 23 with the result that the edge regions 24 and 25 of the covering strip 23 are laminated directly on the soldering mask layer 27. The composite sheet strip 22 is disposed in a dome-like manner above the bonding channel 4 in a manner similar to that in FIG. 1.

FIG. 5 diagrammatically shows a cross-sectional view of the electronic device 1 with the emplaced composite sheet strip 22 above the bonding channel 4 under the action of heat in the direction of the arrow W and shrinkage effects in the direction of an arrow S. In this case, the heat acts relatively uniformly on the surface of the composite sheet strip 22. In this case, the covering strip 23, which contains the shrink sheet strip 28 in this exemplary embodiment, does not become molten but rather merely shrinks, whereas the plastic compound 29 of the sheet strip 11 becomes molten. Consequently, the molten plastic compound 29 is pressed into the bonding channel 4 by the heated shrink sheet strip 28 and simultaneously wets the surfaces of the bonding channel, the bonding connections 14 being completely embedded in the plastic compound 29.

The embedding of the bonding wires 10 and the potting of the bonding channel 4 can be assisted by evacuation in the direction of the arrow A. However, such evacuation or drawing off of the gas cushion in the bonding channel 4 cannot be effected via the chip 2, but rather is possible when the laminate 5 uses an open-pored plastic as its insulating layer 31. In the case of a gas-tight laminate 5, care is taken, preferably in a vacuum chamber, to ensure that there is no gas cushion between the emplaced composite sheet 22 and the bonding channel 4.

FIG. 6 diagrammatically shows a cross-sectional view of the electronic device 1 after the action of heat on the composite heat strip 22. Components of FIG. 6 having functions identical to those in FIGS. 4 and 5 are designated by the same reference symbols and are not explained again. As shown by FIG. 6, the bonding channel 4 is covered by the covering strip 22 in addition to the plastic compound 29 that embeds the bonding wires 14 and wets the surfaces of the bonding channel 4. In this embodiment of the invention, the covering strip permits higher operating temperatures than is made possible by the first exemplary embodiment of FIG. 1. Furthermore, the covering strip 23 ensures that the edge regions 24, 25 of the composite sheet 22 on no account change as a result of the action of heat in such a way that they contaminate the soldering contact areas 8. Rather, the distance a from the soldering contact areas can still slightly increase as a result of the shrinkage effect if the adhesion between the soldering mask layer 27 and the covering strip 22 permits a displacement in the heated state. The minimal elevation h of the bonding channel covering is given by the elevation of the bonding wire connection 14 plus the thickness of the covering strip 23. The elevation h is dimensioned such that it is always smaller than the elevation through the external connection bumps or external connection balls of the electronic device 1 that are to be positioned on the soldering contact areas 8.

One advantage of the second embodiment of the invention over the first embodiment of the invention essentially resides in the fact that higher operating temperatures can be permitted for the electronic device 1 configured in this way, since the plastic compound 29 in the bonding channel 4 is still kept in position by the shrink sheet strip 28, which has a higher melting point, if the plastic compound 29 itself is already in flowable form.

The above embodiments of FIGS. 1 to 6 serve for elucidating the invention and do not limit the scope of protection of the invention as defined by the claims.

We claim:

1. An electronic device, comprising:
a chip having an active surface and contact areas;
a laminate disposed on said active area of said chip and having a bonding channel with edge regions formed therein, said laminate further having contact connection areas, conductor tracks and soldering contact areas and surrounds said bonding channel, said contact areas of said chip disposed along said bonding channel;
bonding wires connecting said contact areas of said chip to said contact connection areas of said laminate; and
a flowable sheet formed of a potting compound surrounding said bonding wires in said bonding channel, said flowable sheet having mutually opposite edge regions overlapping said edge regions of said bonding channel, said flowable sheet selected from the group consisting of a flowable sheet strip and flowable sheet patches, said flowable sheet containing a preformed central region extending between said mutually opposite edge regions and having a bulge and a thickened portion, said preformed central region further having two convexly curved contour lines in cross section.

2. The device according to claim 1, wherein said flowable sheet strip is a composite strip including:
a base sheet strip having at least two preformed, mutually opposite edge regions covering said edge regions of said bonding channel in an overlapping manner, and a preformed central region extending between said opposite edge regions and having a bulge and a thickened portion, said central region further having two convexly curved contour lines in cross-section; and
a covering strip of uniform thickness disposed on said base sheet strip.

3. The device according to claim 2, wherein said covering strip is formed of a shrink material and has edge regions adhesively fixed on said edge regions of said bonding channel.

4. The device according to claim 2, wherein said thickened portion in said central region of said base sheet strip is matched to a volume of said bonding channel.

5. The device according to claim 2, wherein said opposite edge regions of said base sheet strip overlapping said edge regions of said bonding channel are connected gas-tightly to said edge regions of said bonding channel.

6. The device according to claim 1, wherein a flowability of said flowable sheet strip commences at a threshold temperature.

7. The device according to claim 2, wherein a ratio between a maximum thickness of said central region of said base sheet strip to a thickness of said opposite edge regions of said base sheet strip is 3:1.

8. The device according to claim 2, wherein a ratio between a maximum thickness of said a central region of said base sheet strip to a thickness of said opposite edge regions of said base sheet strip is 5:1.

9. The device according to claim 2, wherein an upper one of said two convexly curved contour lines of said base sheet strip has a convex curvature in said central region, the convex curvature is higher than an elevation of said bonding wires connected to said contact connection areas extending beyond said bonding channel.

10. The device according to claim 1, wherein said laminate contains a porous plastic.

11. The device according to claim 1, wherein said laminate is constructed from a gas-tight plastic.

12. The device according to claim 1, wherein said bonding channel has a channel bottom and said contact areas of said chip are disposed at said channel bottom.

13. The device according to claim 1, wherein said laminate has a surface facing said flowable sheet strip and said contact connection areas, said conductor tracks and said soldering contact areas are disposed on said surface facing said flowable sheet strip.

14. The device according to claim 13, including a soldering mask layer disposed on said surface of said laminate facing said flowable sheet strip, said soldering mask layer partly covering said conductor tracks and leaving uncovered both said contact connection areas for bonding and said soldering contact areas for application of one of soldering bumps and soldering balls.

15. The device according to claim 1, including bonding pads having edge regions disposed in said bonding channel and said flowable sheet strip overlaps said edge regions of said bonding pads, said contact areas of said chip disposed one of along said bonding pads and in said bonding pads.

* * * * *